United States Patent
Kang et al.

(10) Patent No.: US 9,711,193 B2
(45) Date of Patent: Jul. 18, 2017

(54) DRIVING SIGNAL CONTROL CIRCUIT AND DRIVING APPARATUS

(71) Applicant: SK hynix Inc., Icheon-si, Gyeonggi-do (KR)

(72) Inventors: Man Keun Kang, Seongnam-si (KR); Saeng Hwan Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/973,442

(22) Filed: Dec. 17, 2015

(65) Prior Publication Data

US 2017/0019100 A1   Jan. 19, 2017

(30) Foreign Application Priority Data

Jul. 17, 2015   (KR) .......................... 10-2015-0101612

(51) Int. Cl.
| | |
|---|---|
| *H03B 1/00* | (2006.01) |
| *H03K 3/00* | (2006.01) |
| *G11C 7/06* | (2006.01) |
| *H03K 23/40* | (2006.01) |
| *H03K 5/133* | (2014.01) |
| *H03K 5/00* | (2006.01) |

(52) U.S. Cl.
CPC .............. *G11C 7/06* (2013.01); *H03K 5/133* (2013.01); *H03K 23/40* (2013.01); *H03K 2005/00019* (2013.01)

(58) Field of Classification Search
USPC ................................................. 327/108–112
See application file for complete search history.

(56) References Cited

U.S. PATENT DOCUMENTS

| | | | | |
|---|---|---|---|---|
| 5,899,570 A | * | 5/1999 | Darmawaskita ....... | G01K 7/203 374/170 |
| 6,118,490 A | * | 9/2000 | Moore ..................... | H04N 5/44 348/473 |
| 6,313,670 B1 | * | 11/2001 | Song .................... | G11C 7/1051 327/108 |
| 7,656,710 B1 | * | 2/2010 | Wong .................. | G11C 11/5628 365/185.18 |
| 2010/0172191 A1 | * | 7/2010 | Chen .................... | G11C 7/1006 365/189.05 |
| 2011/0242087 A1 | * | 10/2011 | Ebisuno ............... | G09G 3/3233 345/212 |
| 2013/0162622 A1 | * | 6/2013 | Ebisuno ............... | G09G 3/3208 345/212 |

(Continued)

FOREIGN PATENT DOCUMENTS

| | | |
|---|---|---|
| KR | 1020030047013 A | 6/2003 |
| KR | 1020080043063 A | 5/2008 |
| KR | 1020100001528 A | 1/2010 |

*Primary Examiner* — Adam Houston
(74) *Attorney, Agent, or Firm* — William Park & Associates Ltd.

(57) ABSTRACT

A driving signal control circuit includes a discharge circuit, a counter circuit, and a control circuit. The discharge circuit is configured to compare a monitored voltage and a reference voltage, and generate a discharge signal. The monitored voltage is proportional to a core voltage. The counter circuit is configured to perform an up/down count operation according to the discharge signal, and generate a count signal. The control circuit is configured to generate a driving signal which has an enable period proportional to the count signal.

20 Claims, 14 Drawing Sheets

(56) References Cited

U.S. PATENT DOCUMENTS

2015/0222182 A1\* 8/2015 Searles ............... H02M 3/1588
327/541
2015/0226692 A1\* 8/2015 Dastgheib ................. G05F 3/02
327/540

\* cited by examiner

DRIVING SIGNAL CONTROL CIRCUIT AND DRIVING APPARATUS

CROSS-REFERENCES TO RELATED APPLICATION

The present application claims priority under 35 U.S.C. §119(a) to Korean application number 10-2015-0101612 filed in the Korean Intellectual Property Office on Jul. 17, 2015, which is incorporated herein by reference in its entirety.

BACKGROUND

1. Technical Field

Various embodiments generally relate to a driving signal control circuit and a driving apparatus.

2. Related Art

A semiconductor device may store data by retaining electrical charges in memory cells. Memory cells are typically electrically coupled between bit lines and word lines that intersect the bit lines. The bit lines are configured as bit line pairs, where each bit line pair includes a bit line and a complementary bit line.

Data stored in a memory cell is sensed as a fine electric charge on a bit line, and developed relative to a complementary bit line. A fine charge difference between the lines is amplified. For recording and reading data, the steps of precharging the bit line pair with a predetermined voltage and developing the bit line pair are repeated.

Accordingly, driving signal control circuits and driving apparatuses which overcome the deficiencies of the prior art are needed.

DETAILED DESCRIPTION

Figure 1:
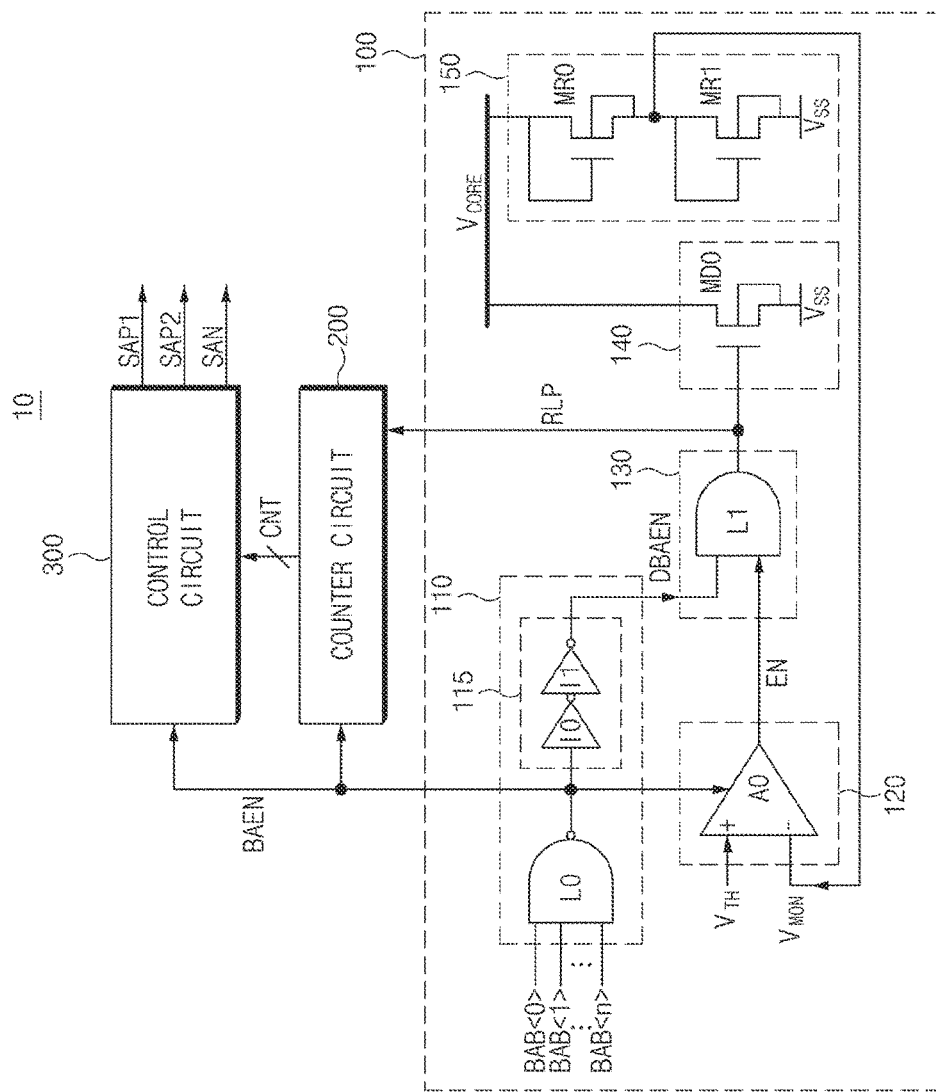
FIG. 1 is a diagram illustrating an example of a driving signal control circuit in accordance with an embodiment.

Various embodiments of the present disclosure are directed to a driving signal control circuit configured to sense the magnitude of a core voltage which varies in accordance with a driving operation, when being activated, and performs an up/down count operation according to the magnitude of the core voltage.

In addition, various embodiments of the present embodiment are directed to a driving signal control circuit configured to control an overdriving period according to a result of performing a count operation, and a driving apparatus including the same.

Further, various embodiments of the present disclosure are directed to a driving signal control circuit configured to retain the magnitude of a core voltage through controlling an overdriving period by sensing the magnitude of the core voltage, thereby reducing current consumption due to a rise of the core voltage, and a driving apparatus including the same.

In an embodiment, a driving signal control circuit may include a discharge circuit, a counter circuit, and a control circuit. The discharge circuit is configured to compare a monitored voltage and a reference voltage, and generate a discharge signal. The monitored voltage is proportional to a core voltage. The counter circuit is configured to perform an up/down count operation according to the discharge signal, and generate a count signal. The control circuit is configured to generate a driving signal which has an enable period proportional to the count signal.

In an embodiment, a driving apparatus may include a driving signal control circuit and a driving circuit. The driving signal control circuit is configured to generate a flag signal by comparing a monitored voltage and a reference voltage, while an active operation is performed in response to a command signal. The monitored voltage is proportional to a core voltage. The driving signal control circuit is further configured to generate a first driving signal which has a different enable period according to a count signal generated by performing an up/down count operation based on the flag signal. The driving circuit is configured to provide a power supply voltage greater than the core voltage to a sense amplifier in response to the first driving signal.

Thus, according to various embodiments, the driving signal control circuit and the driving apparatus control the enable period of a driving signal which controls overdriving, based on a signal generated for discharge of a core voltage. Therefore, it is possible to control an overdriving period that may exert an influence on a rise of the core voltage, while decreasing the magnitude of the core voltage itself. Hereinafter, a driving signal control circuit and a driving apparatus will be described below with reference to the accompanying drawings through various examples of embodiments. The same reference numerals will be used to refer to the same components, and repeated descriptions for the same components will be omitted.

With respect to the various embodiments of the present disclosure, specific structural and functional descriptions are merely illustrative for the purpose of explaining the embodiments. Various embodiments may be provided in a variety of forms and should not be interpreted as being limited to those disclosed.

Expressions, such as "a first", "a second", "the first" and "the second" used in various embodiments, may describe various components irrespective of their sequence and/or importance and do not limit the corresponding components. For example, a first component may be named a second component and the second component may be named the first component without departing from the scope of the present disclosure.

Terms used in this document are used to only describe specific embodiments and may not be intended to restrict the scopes of other embodiments. An expression of a singular number includes an expression of a plural number unless clearly defined otherwise in context.

All terms used herein, including technical terms or scientific terms, have the same meanings as those generally understood by persons of ordinary skill in the technical field to which the disclosure pertains. The terms, such as terms that are generally used and defined in dictionaries, should be construed as having meanings identical to those that are used in the context of related technology and should not be construed as having ideal or excessively formal meanings unless explicitly defined otherwise. In some embodiments, terms may not be interpreted as excluding the embodiments of the present disclosure although the terms have been defined in this document.

FIG. 1 is a diagram illustrating an example of a driving signal control circuit in accordance with an embodiment. Viewing FIG. 1, a driving signal control circuit 10 may include a discharge circuit 100, a counter circuit 200, and a control circuit 300.

The discharge circuit 100 may be configured to compare a monitored voltage $V_{MON}$ and a threshold voltage $V_{TH}$. The monitored voltage $V_{MON}$ may be a core voltage ("$V_{CORE}$"), or a voltage that is proportional to the core voltage $V_{CORE}$. For example, the threshold voltage may be referred to as a reference voltage.

In an embodiment, the monitored voltage $V_{MON}$ may be directly proportional to the core voltage $V_{CORE}$, for example, the monitored voltage $V_{MON}$ may be equal to or substantially equal to $V_{CORE}/2$.

The discharge circuit 100 may be configured to discharge the core voltage $V_{CORE}$ when the monitored voltage $V_{MON}$ is greater than the threshold voltage $V_{TH}$. Where the monitored voltage $V_{MON}$ is substantially $V_{CORE}/2$, the discharge circuit 100 determines the case where the core voltage $V_{CORE}$ has a voltage value greater than two (2) times the threshold voltage $V_{TH}$.

According to an embodiment, the discharge circuit 100 may be configured to enable a discharge signal RLP when at least one memory bank is enabled while the monitored voltage $V_{MON}$ (e.g. $V_{CORE}/2$) is greater than the threshold voltage $V_{TH}$.

The discharge circuit 100 may include a bank enable circuit 110, a comparator 120, a discharge signal generation circuit 130, a discharge circuit 140, and a divider circuit 150.

The bank enable circuit 110 may be configured to receive a plurality of bank active signals BAB<0>, BAB<1>, . . . and BAB<n>. The bank enable circuit 110 may be further configured to generate a bank enable signal BAEN in the case where at least one bank active signal is enabled among the plurality of bank active signals BAB<0>, BAB<1>, . . . and BAB<n>. The bank enable circuit 110 may be further configured to provide the generated bank enable signal BAEN to the discharge signal generation circuit 130.

For example, the bank enable circuit 110 may include a first operator L0 which performs a NAND logic function or operation. Here, the bank enable circuit 110 may be configured to provide a NAND operation on the plurality of bank active signals BAB<0>, BAB<1>, . . . and BAB<n>, and generate the bank enable signal BAEN. The first operator L0 may include a NAND operator.

According to an embodiment, the bank enable circuit 110 may further include a delay circuit 115. The delay circuit 115 may include a plurality of inverters I0 and I1. The delay circuit 115 may be configured to delay the bank enable signal BAEN outputted from the first operator L0. The delay circuit 115 may be further configured to provide a delayed bank enable signal DBAEN to the discharge signal generation circuit 130. The bank enable circuit 110 may include the delay circuit 115 to provide a predetermined stabilization time to sense the magnitude of the core voltage $V_{CORE}$ after an active command is provided to a memory bank.

The comparator 120 may be configured to compare the monitored voltage $V_{MON}$ (e.g. $V_{CORE}/2$) and the threshold voltage $V_{TH}$. The comparator 120 may be configured to output an enable signal EN when the monitored voltage $V_{MON}$ is greater than the threshold voltage $V_{TH}$.

For example, if $V_{MON} \approx V_{CORE}/2$, then comparator 120 may output the enable signal EN when $V_{MON} > V_{TH}$.

According to an embodiment, the comparator 120 may be configured to output the enable signal EN in response to the bank enable signal BAEN. For example, the comparator 120 may be driven according to the bank enable signal BAEN, generate the enable signal EN by comparing the monitored voltage $V_{MON}$ and threshold voltage $V_{TH}$, and provide the enable signal EN to the discharge signal generation circuit 130.

The discharge signal generation circuit 130 may be configured to generate a discharge signal RLP, based on the delayed bank enable signal DBAEN received from the bank enable circuit 110 and the enable signal EN.

According to an embodiment, the discharge signal generation circuit 130 may be configured to output the discharge signal RLP in the case where both the delayed bank enable signal DBAEN and the enable signal EN are enabled. When the delayed bank enable signal DBAEN is output, it indicates that a predetermined time has passed after an active command is provided to at least one of the plurality of memory banks. When enable signal EN is output, it indicates that the core voltage $V_{CORE}$ has exceeded the threshold voltage $V_{TH}$. For example, the enable signal EN is output when the monitored voltage $V_{MON}$ has exceeded the threshold voltage $V_{TH}$.

Thus, the discharge signal generation circuit 130 may be configured to output the discharge signal RLP such that the value of the core voltage $V_{CORE}$ is decreased, if the value of the core voltage $V_{CORE}$ exceeds the predetermined value when the predetermined time has passed after an active command is provided to at least one of the plurality of memory banks.

For example, the discharge signal generation circuit 130 may include a second operator L1 configured to perform an AND operation or logic function.

The discharge circuit 140 may be configured to discharge the core voltage $V_{CORE}$ to a ground voltage VSS in response to the discharge signal RLP. This action decreases the magnitude of the core voltage $V_{CORE}$. For example, the discharge circuit 140 may include a discharge transistor MD0 including a first terminal which is electrically coupled with the ground voltage $V_{SS}$, a gate terminal which receives the discharge signal RLP and a second terminal which is electrically coupled with the core voltage $V_{CORE}$.

According to an embodiment, the body of the discharge transistor MD0 and the first terminal may be electrically coupled, and thus, a threshold voltage may be stabilized.

The divider circuit 150 may be configured to divide the core voltage $V_{CORE}$ by a particular amount (e.g. divide by two), and output a resultant signal to the comparator 120.

The resultant signal may be the monitored voltage $V_{MON}$ (e.g. $V_{MON} \approx V_{CORE}/2$). More generally, the divider circuit 150 may be any suitable level adjusting circuit configured to output a voltage that is proportional to (e.g. directly proportional to) the core voltage $V_{CORE}$.

In an embodiment, the divider circuit 150 may include a first resistor transistor MR0 and a second resistor transistor MR1. For example, the first resistor transistor MR0 and the second resistor transistor MR1 as the same resistor components may divide the core voltage $V_{CORE}$ in half.

The counter circuit 200 may be configured to generate a count signal CNT, based on the discharge signal RLP and the bank enable signal BAEN provided from the discharge circuit 100.

In the case where the discharge signal RLP is enabled while the bank enable signal BAEN is enabled, the counter circuit 200 may be configured to determine that the value of the core voltage $V_{CORE}$ is increased during a time in which a certain bank is enabled, and down-counts the count signal CNT at a current state.

Conversely, in the case where the discharge signal RLP is not enabled while the bank enable signal BAEN is enabled, the counter circuit 200 may be configured to determine that the core voltage $V_{CORE}$ does not exceed the reference value (for example, 2 times the threshold voltage $V_{TH}$) during a time in which a certain bank is enabled, and up-counts the count signal CNT at a current state.

Here, the up counting and down counting have been described for the sake of convenience in explanation. The counter circuit 200 may be configured to perform a count operation in the opposite manner than that provided the above description.

The count signal CNT provided from the counter circuit 200 may be configured as a plurality of bits or logic levels ('0's and '1's).

The control circuit 300 may be configured to receive the count signal CNT and generate a driving signal SAP1 which has a period corresponding to the count signal CNT. According to an embodiment, the control circuit 300 may be configured to generate and provide a driving signal SAP1 which is enabled with a different period according to the count value of the count signal CNT.

Since the counter circuit 200 may be configured to generate the count signal CNT by sensing the magnitude of the core voltage $V_{CORE}$ while an active operation is performed for a memory bank, it is possible to check whether the core voltage $V_{CORE}$ should be increased or decreased in its current state, through use of the value of the count signal CNT.

Accordingly, the control circuit 300 may be configured to perform a driving operation by generating a driving signal SAP1 which is enabled with a period corresponding to the value of the count signal CNT. For example, the driving signal SAP1 may correspond to an overdriving signal.

According to an embodiment, the control circuit 300 may include other driving signals SAP2 and SAN. The driving signals SAP1, SAP2 and SAN from the control circuit 300 will be described below in detail with reference to FIG. 2.

As described above, the driving signal control circuit 10 may be configured to count a specified value in response to the discharge signal RLP. The discharge signal RLP is enabled according to the magnitude of the core voltage $V_{CORE}$ being increased, in the case where a memory bank is activated. The driving signal control circuit 10 may be further configured to control a period during which overdriving is performed, according to a count value. Thus, the driving signal control circuit 10 may be configured to control an overdriving period based on the discharge signal RLP which is generated to control the core voltage $V_{CORE}$.

Figure 2:
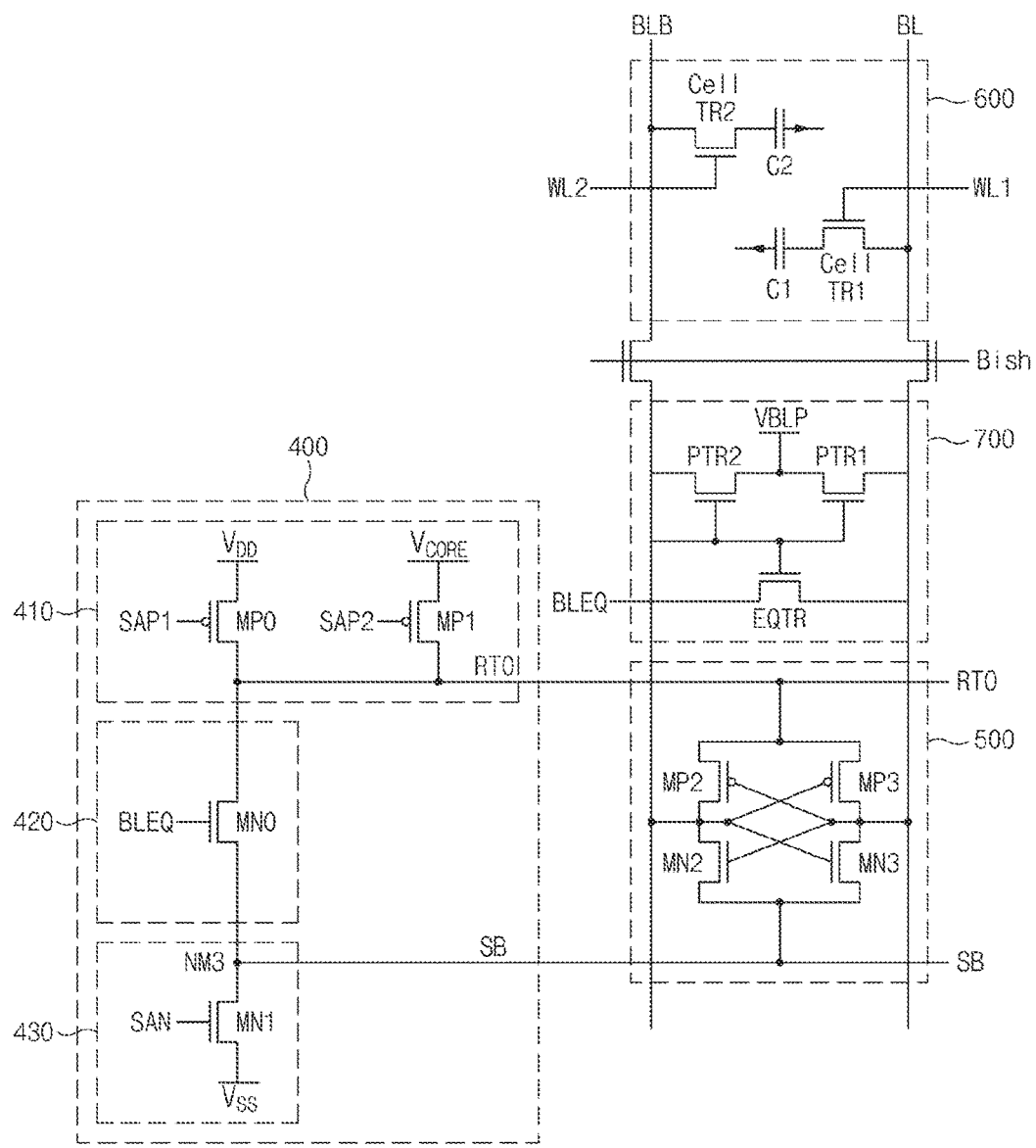
FIG. 2 is a diagram illustrating an example of driving components with which the driving signal control circuit in accordance with the embodiment is electrically coupled.

FIG. 2 is a diagram illustrating an example of driver components 450 with which the driving signal control circuit 10 of FIG. 1 are electrically coupled.

In various embodiments of the present disclosure, driver components 450 of FIG. 2 and the driving signal control circuit 10 of FIG. 1 may be part of a driving apparatus in accordance with an embodiment.

The driver components 450 may include a driving circuit 400, a sense amplifier 500, a memory cell 600, and a bit line equalization (BLE) circuit 700.

The driver circuit 400 may include a first sensing line signal generation (SLSG) circuit 410, an equalization circuit 420, and a second sensing line signal generation (SLSG) circuit 430.

The first SLSG circuit 410 may be configured to selectively provide a power supply voltage $V_{DD}$ and the core voltage $V_{CORE}$ to a first sensing line RTO in response to the first driving signal SAP1 and the second driving signal SAP2.

The first SLSG circuit 410 may include a first PMOS transistor MP0 which is turned on in response to the first driving signal SAP1 and a second PMOS transistor MP1 which is turned on in response to the second driving signal SAP2.

The core voltage $V_{CORE}$ may be less than the power supply voltage $V_{DD}$. When an active command is received from an external device, data may be written in the memory cell 600 or data stored in the memory cell 600 may be read out.

In order for reading or writing of data, the first SLSG circuit 410 may be configured to enable the first driving signal SAP1 and provide the power supply voltage $V_{DD}$ to the first sensing line RTO. This action is performed when the predetermined time has passed after an active command is applied, to quickly raise the voltage level of the first sensing line RTO. The providing of the power supply voltage $V_{DD}$ greater than the core voltage $V_{CORE}$, which is generally used to more quickly raise the voltage of the first sensing line RTO, may be referred to as an overdriving operation.

After the voltage of the first sensing line RTO is (quickly) raised by the power supply voltage $V_{DD}$, the core voltage $V_{CORE}$ (by which the first sensing line RTO should be generally driven) is provided by the second PMOS transistor MP1. Therefore, the second driving signal SAP2 is enabled at a time when the first driving signal SAP1 is disabled. The power supply voltage $V_{DD}$ may be introduced into the core voltage $V_{CORE}$ at a time when the two PMOS transistors MP0 and MP1 are turned off and turned on.

For example, the time during which the first driving signal SAP1 is enabled is controlled by the count signal CNT. The degree by which the core voltage $V_{CORE}$ is influenced by the power supply voltage $V_{DD}$ may be proportional to the time during which the first driving signal SAP1 is enabled. Therefore, the driving signal control circuit 10 may be configured to control the time during which the first driving signal SAP1 is enabled, by sensing the level of the core voltage $V_{CORE}$.

The equalization circuit 420 is configured to equalize the first sensing line RTO and a second sensing line SB in response to a bit line equalization signal BLEQ such that the first sensing line RTO and the second sensing line SB have the same voltage level. The bit line equalization signal BLEQ may be enabled when it is necessary to cause a bit line BL and a complementary bit line BLB to have the same value, as in a precharge operation.

For example, the equalization circuit 420 may include a transistor, such as a first NMOS transistor MN0. The first NMOS transistor MN0 may include a first terminal which is electrically coupled to the second sensing line SB, a gate terminal which receives the bit line equalization signal BLEQ, and a second terminal which is electrically coupled to the first sensing line RTO. The first NMOS transistor MN0 may be configured to electrically couple the first sensing line RTO and the second sensing line SB in response to the bit line equalization signal BLEQ.

The second SLSG circuit 430 may be configured to provide the ground voltage $V_{SS}$ to the second sensing line SB in response to the third driving signal SAN. According to an embodiment, the second sensing line signal generation circuit 430 may include a second NMOS transistor MN1. The second NMOS transistor MN1 may include a first terminal which is electrically coupled with the ground voltage $V_{SS}$, a gate terminal which is applied with the third driving signal SAN and a second terminal which is electrically coupled with the second sensing line SB.

The sense amplifier 500 may be configured to be driven by the first sensing line RTO and the second sensing line SB. The sense amplifier 500 may be configured to develop the fine voltage difference of the bit line pair BL and BLB by the difference between the voltages applied to the first sensing line RTO and the second sensing line SB. Accordingly, the sense amplifier 500 may be configured to determine data, based on the difference of the first sensing line RTO and the second sensing line SB.

According to an embodiment, the sense amplifier 500 may include a third PMOS transistor MP2 which may be electrically coupled between the first sensing line RTO and the complementary bit line BLB. The sense amplifier 500 may also include a fourth PMOS transistor MP3 which may be electrically coupled between the first sensing line RTO and the bit line BL. Further, the sense amplifier 500 may include a third NMOS transistor MN2 which may be electrically coupled between the second sensing line SB and the complementary bit line BLB, as well as and a fourth NMOS transistor MN3 which is electrically coupled between the second sensing line SB and the bit line BL.

The gate terminals of the third PMOS transistor MP2 and the third NMOS transistor MN2 may be electrically coupled with the bit line BL. The gate terminals of the fourth PMOS transistor MP3 and the fourth NMOS transistor MN3 may be electrically coupled with the complementary bit line BLB.

The memory cell 600 may include a first cell transistor Cell TR1, which includes a first terminal, a gate terminal, and a second terminal. The first terminal may be electrically coupled to the bit line BL. The gate terminal may be electrically coupled with a first word line WL1. The second terminal may be electrically coupled with a first storage element C1. The first cell transistor Cell TR1 may store data in such a way as to provide the charges stored in the first storage element C1 to the bit line BL in response to the first word line WL1, by charging or discharging charges into or from the first storage element C1.

The first storage element C1 may be electrically coupled between the second terminal of the first cell transistor Cell TR1 and the ground voltage $V_{SS}$.

The memory cell 600 may further include a second cell transistor Cell TR2 including a first terminal, a gate terminal, and a second terminal. The first terminal may be electrically coupled to the complementary bit line BLB. The gate terminal may be electrically coupled with a second word line WL2. The second terminal may be electrically coupled with a second storage element C2.

The first cell transistor Cell TR1 and the second cell transistor Cell TR2 may be configured to perform the same or similar operation. For example, the second cell transistor Cell TR2 may store data in such a way of charging the charges loaded on the complementary bit line BLB into the second storage element C2 by enabling the second word line WL2.

The first and second cell transistor Cell TR1 and Cell TR2 may be coupled to the BLE circuit 700 and/or the sense amplifier 500 in response to the bit line selection signal Bish.

The bit line equalization circuit 700 may include first and second precharge transistors PTR1 and PTR2 and an equalization transistor EQTR. The first and second precharge transistors PTR1 and PTR2 may be configured to provide a bit line precharge voltage VBLP to the bit line pair BL and BLB in response to the bit line equalization signal BLEQ.

The equalization transistor EQTR may electrically couple the bit line BL and the complementary bit line BLB in response to the bit line equalization signal BLEQ, and makes the voltage levels of the bit line pair BL and BLB the same.

In an embodiment, the driving apparatus may be configured to provide the power supply voltage $V_{DD}$ to the first sensing line RTO in response to the first driving signal SAP1 having an enable period corresponding to the count signal CNT. Accordingly, in the case where the core voltage $V_{CORE}$ rises, the rising amount of the core voltage $V_{CORE}$ may be decreased as the overdriving period is shortened.

Figure 3:
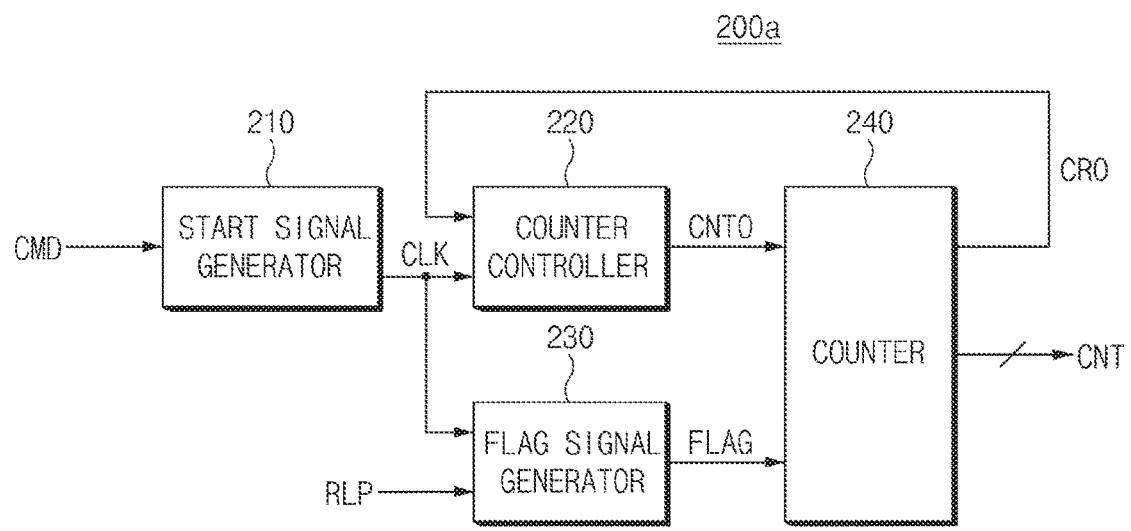
FIG. 3 is a block diagram illustrating an example of a counter circuit in accordance with an embodiment.

FIG. 3 is a block diagram illustrating an example of a counter circuit 200 of FIG. 1 in accordance with an embodiment.

Referring to FIG. 3, a counter circuit 200a may include a start signal generator 210, a counter controller 220, a flag signal generator 230, and a counter 240.

The start signal generator 210 may be configured to generate a clock signal CLK based on a command signal CMD. The command signal CMD may be a signal which is provided from the external device such as a host and is decoded, and the clock signal CLK may be provided in a pattern in which a pulse is generated after a preset time has passed in response to the command signal CMD.

The counter controller 220 may be configured to generate a count output signal CNTO in response to the clock signal CLK. The counter controller 220 generally provides the clock signal CLK as it is, as the count output signal CNTO, to the counter 240. However, in the case where a predetermined condition is satisfied in the counter 240 (and thus a carry output signal CRO is enabled), the counter controller 220 provides the count output signal CNTO such that the operation of the counter 240 is interrupted.

The flag signal generator 230 may be configured to generate a flag signal FLAG based on the discharge signal RLP and the clock signal CLK. According to an embodiment, the flag signal generator 230 may be configured to generate the flag signal FLAG, which is enabled in response to that the discharge signal RLP is enabled and is disabled in response to the clock signal CLK.

According to an embodiment, the flag signal generator 230 may be configured to not immediately disable the flag signal FLAG in response to the clock signal CLK. The flag signal generator 230 may be configured to disable the flag signal FLAG after the preset time has passed in response to the clock signal CLK.

The counter 240 may be configured to perform an up/down count operation according to the flag signal FLAG in synchronization with the count output signal CNTO, and provide the count signal CNT. The counter 240 may include a plurality of count circuits. When counting by the count circuits is completed, the counter 240 may enable the carry output signal CRO and provide the enabled carry output signal CRO to the counter controller 220 such that the count operation is ended.

The counter circuit 200a may be configured to perform the up/down count operation according to the flag signal FLAG in synchronization with the clock signal CLK, and generate the count signal CNT. The clock signal CLK may be enabled in response to the command signal CMD.

Since the flag signal FLAG is generated in response to the discharge signal RLP, it may be understood that the count operation is performed as the core voltage $V_{CORE}$ increases when an active command is generated. Here, the discharge signal RLP is generated in the case where the monitored voltage $V_{MON}$ is greater than the threshold voltage $V_{TH}$.

Figure 4:
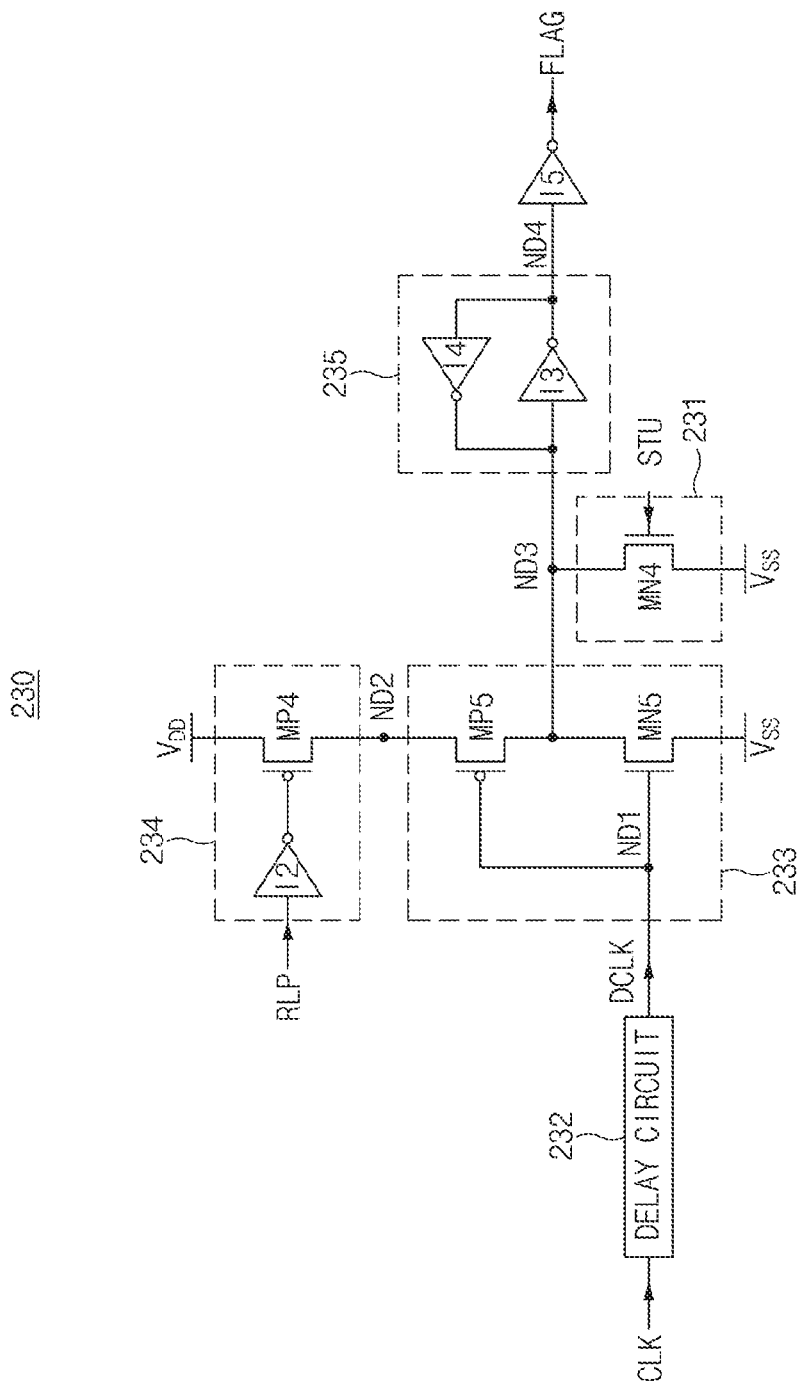
FIG. 4 is a diagram illustrating an example of a flag signal generator in accordance with an embodiment.

FIG. 4 is a diagram illustrating an example of a flag signal generator in accordance with an embodiment.

Referring to FIG. 4, the flag signal generator 230 may include a delay circuit 232, a disable circuit 233, an enable circuit 234, and a latch 235.

The delay circuit 232 may be configured to receive the clock signal CLK. The delay circuit 232 may be configured to delay the clock signal CLK by the preset time. The delay circuit 232 may be configured to provide a delayed clock signal DCLK to a first node ND1.

If the flag signal FLAG is disabled immediately in response to the clock signal CLK being enabled, the counter 240 may not normally count the flag signal FLAG. The reason is that the counter 240 may be configured to count the flag signal FLAG in synchronization with the clock signal CLK as described above with reference to FIG. 3.

Accordingly, the flag signal generator 230 may include the delay circuit 232 and disable the flag signal FLAG in response to the delayed clock signal DCLK, which is generated by delaying the clock signal CLK by the preset time.

The disable circuit 233 may include a sixth PMOS transistor MP5 having a first terminal, a gate terminal, and a second terminal. The first terminal may be electrically coupled to a second node ND2. The gate terminal may be electrically coupled to a first node ND1. The second terminal may be electrically coupled to a third node ND3.

The disable circuit 233 may further include a sixth NMOS transistor MN5 having a first terminal, a gate terminal, and a second terminal. The first terminal may be electrically coupled with the ground voltage $V_{SS}$. The gate terminal may be electrically coupled with the first node ND1. The second terminal may be electrically coupled with the third node ND3.

In the disable circuit 233, there is a case where the delayed clock signal DCLK corresponds to a logic high state (i.e. after the clock signal CLK is enabled and the preset time has passed). Here, the sixth NMOS transistor MN5 may be turned on and transition the third node ND3 to the level of the ground voltage $V_{SS}$. In general, during a period in which the clock signal CLK is not enabled, the sixth PMOS transistor MP5 may be turned on and electrically couple the second node ND2 and the third node ND3.

The enable circuit 234 may be configured to provide the power supply voltage $V_{DD}$ to the second node ND2 in response to the discharge signal RLP. Therefore, during the period in which the clock signal CLK is not enabled, the power supply voltage $V_{DD}$ may be provided to the third node ND3.

According to an embodiment, the enable circuit 234 may include a third inverter 12 and a fifth PMOS transistor MP4. The fifth PMOS transistor MP4 may include a first terminal, a gate terminal, and a second terminal. The first terminal may be electrically coupled with the power supply voltage $V_{DD}$. The gate terminal may receive a signal generated as the discharge signal RLP which is inverted by the third inverter 12. The second terminal may be electrically coupled to the second node ND2.

The latch 235 may be electrically coupled between the third node ND3 and a fourth node ND4. The latch 235 may be configured to store the values of the respective nodes. For example, the latch 235 may include a fourth inverter 13 and a fifth inverter 14.

The fourth inverter 13 may include an input terminal and an output terminal. The input terminal of the fourth inverter 13 may be electrically coupled to the third node ND3. The output terminal of the fourth inverter 13 may be electrically coupled to the fourth node ND4.

Similarly, the fifth inverter 14 may include an input terminal and an output terminal. The input terminal of the fifth inverter 14 may be electrically coupled to the fourth node ND4. The output terminal of the fifth inverter 14 may be electrically coupled to the third node ND3.

The value of the fourth node ND4 is inverted by a sixth inverter 15 and is provided as the flag signal FLAG. As a result, the flag signal FLAG may correspond to the voltage level of the third node ND3.

According to an embodiment, the flag signal generator 230 may further include an initialization circuit 231. The initialization circuit 231 may be configured to transition the third node ND3 to the level of the ground voltage $V_{SS}$ (i.e. a logic low state) in response to a start-up signal STU.

The initialization circuit 231 may be or include a fifth NMOS transistor MN4. As the third node ND3 transitions to the logic low state, the fourth node ND4 transitions to a logic high state and the flag signal FLAG is initialized to a logic low state.

Figure 5:
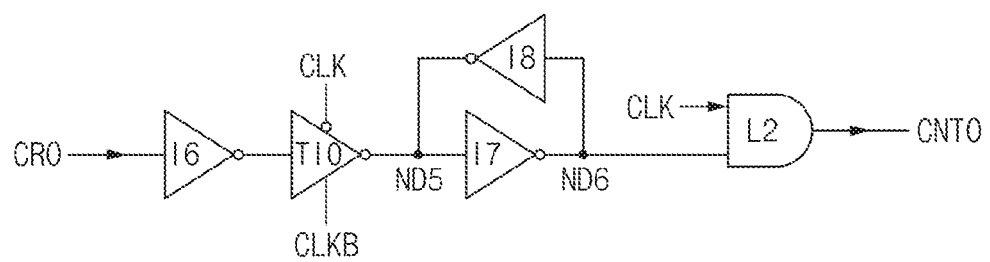
FIG. 5 is a diagram illustrating an example of a counter controller in accordance with an embodiment.

FIG. 5 is a diagram illustrating an example of a counter controller in accordance with an embodiment.

The counter controller 220 may be configured to invert the carry output signal CRO. The counter controller 220 may be configured to perform an AND operation on the clock signal CLK and the inverted signal of the carry output signal CRO, and provide the count output signal CNTO. For example, before the counter 240 counts a maximum value (i.e. while the counter 240 normally performs counting), the carry output signal CRO may be disabled and retain a logic low state. Accordingly, while the count operation is normally performed, the counter controller 220 may provide the clock signal CLK as it is, as the count output signal CNTO.

If the counter 240 counts the maximum value that is predetermined and the carry output signal CRO is enabled, the counter controller 220 disables the count output signal CNTO.

Referring to FIG. 5, the counter controller 220 may include a seventh inverter 16, a first response inverter TI0, eighth and ninth inverters 17 and 18, and a third operator L2. The first response inverter TI0 may be driven according to the clock signal CLK. Eighth and ninth inverters 17 and 18 configure a latch. Input terminals and output terminals of eighth and ninth inverters 17 and 18 are electrically coupled mutually in a cross-coupled manner.

The seventh inverter 16 may be configured to invert the carry output signal CRO and provide the inverted signal of the carry output signal CRO to the first response inverter TI0. The first response inverter TI0 may be configured to perform an inverting operation in the case where the clock signal CLK is disabled. The first response inverter T10 may be configured to provide the signal received from the seventh inverter 16, as the carry output signal CRO, to a fifth node ND5.

The eighth inverter 17 may include the input terminal which is electrically coupled with the fifth node ND5, and the output terminal which is electrically coupled to a sixth node ND6. The ninth inverter 18 may include the input terminal which is electrically coupled to the sixth node ND6 and the output terminal which is electrically coupled to the fifth node ND5, by which the latch is configured.

The third operator L2 may be configured to perform an AND operation on the voltage value of the sixth node ND6 and the clock signal CLK, and provide the count output signal CNTO.

Figure 6:
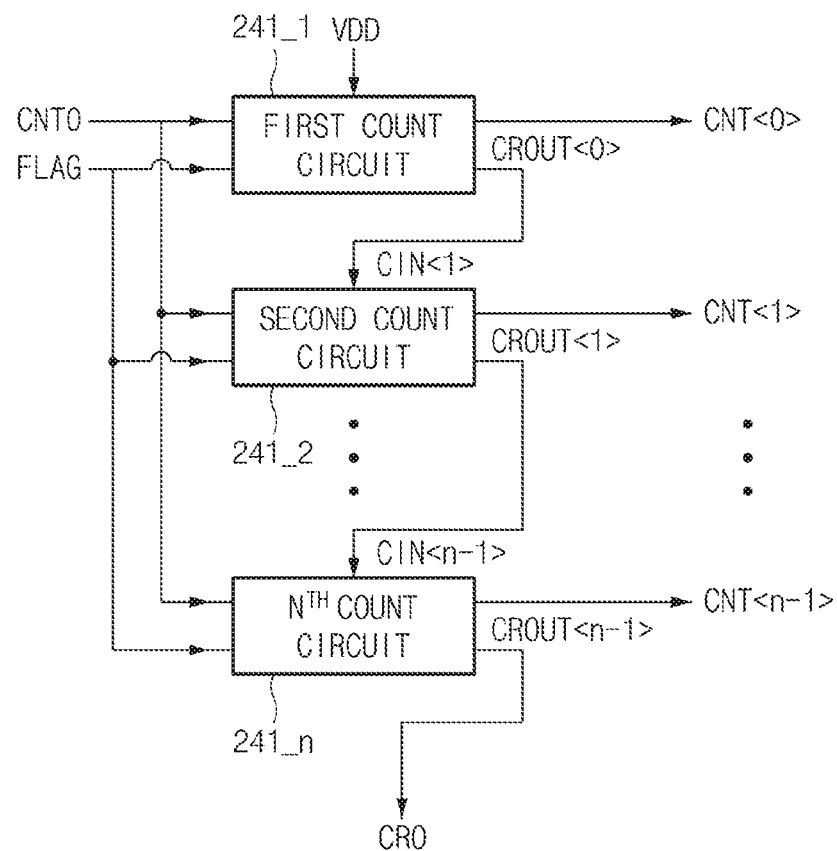
FIG. 6 is a block diagram illustrating an example of a counter in accordance with an embodiment.

FIG. 6 is a block diagram illustrating an example of a counter in accordance with an embodiment.

Referring to FIG. 6, the counter 240 may include a plurality of count circuits 241_1, 241_2, . . . and 241_n. The count circuits 241_1, 241_2, . . . and 241_n may have a different number depending on the embodiment. Also, the time at which the carry output signal CRO is enabled may vary according to the number of count circuits.

Note that the count circuits 241_1, 241_2, . . . and 241_n may be configured to perform the up/down count operation in the opposite manner.

The count signal CNT may be configured as a plurality of count bits or logic levels CNT<0>, CNT<1>, . . . and CNT<n−1>.

The first count circuit 241_1 may be configured to be driven by the power supply voltage $V_{DD}$. The first count circuit 241_1 may be configured to count the flag signal FLAG in synchronization with the count output signal CNTO, and provide the first count bit CNT<0> and a first carry output bit CROUT<0>.

The second count circuit 241_2 may be configured to receive the first carry output bit CROUT<0> as a first carry input bit CIN<1>. The second count circuit 241_2 may be configured to be driven by the first carry input bit CIN<1>. The second count circuit 241_2 may be configured to count the flag signal FLAG in synchronization with the count output signal CNTO, and provide the second count bit CNT<1> and a second carry output bit CROUT<1>.

The plurality of count circuits 241_1, 241_2, . . . and 241_n may be configured to sequentially perform the same operation. The $n^{th}$ count bit CNT<n−1> is provided by the final $n^{th}$ count circuit 241_n, and an $n^{th}$ carry output bit CROUT<n−1> is outputted as the carry output signal CRO.

The counter 240 may be configured to perform the up/down count operation differently according to the value of the flag signal FLAG in response to the count output signal CNTO. For example, the count value of the count signal CNT may be increased in the case where the flag signal FLAG is enabled according to the clock signal CLK. On the other hand, the count value of the count signal CNT may be decreased in the case where the flag signal FLAG is disabled according to the clock signal CLK.

Since each of the count circuits 241_1, 241_2, . . . and 241_n may be similar to an up/down count circuit which is generally known in the art, detailed description thereof will be omitted herein.

Figure 7:
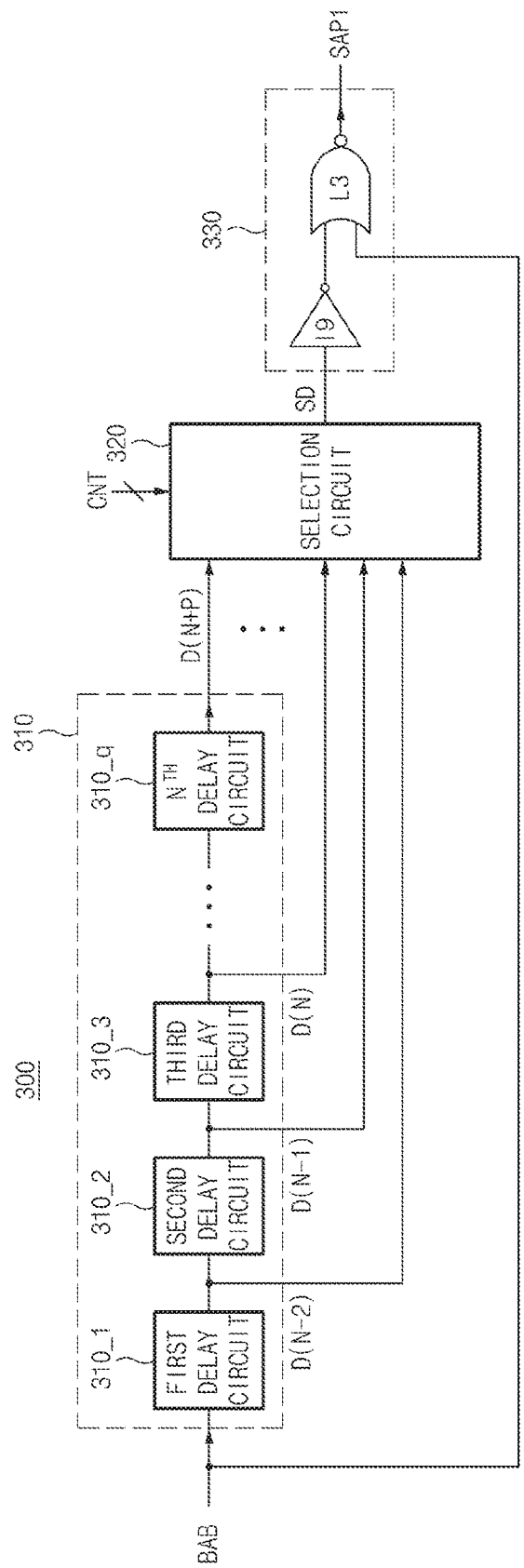
FIG. 7 is a diagram illustrating an example of a control circuit in accordance with an embodiment.

FIG. 7 is a diagram illustrating an example of a control circuit in accordance with an embodiment.

According to an embodiment, the control circuit 300 may include circuits configured to generate the first to third driving signals SAP1, SAP2 and SAN. However, in FIG. 7, for the sake of convenience in explanation, only a configuration to generate the first driving signal SAP1 is illustrated, and descriptions therefor will be made below. A control circuit 300 may be associated with a corresponding memory bank.

Referring to FIG. 7, the control circuit 300 may include a plurality of delay circuits 310, a selection circuit 320, and a driving signal output circuit 330.

The plurality of delay circuits 310 including delay circuits 310_1, 310_2, 310_3, . . . and 310_q may provide a plurality of delayed signals D(N−2), D(N−1), D(N), . . . and D(N+p) which have different delay times. This may be done by receiving and delaying a complementary bank active signal BAB by a preselected time. According to an embodiment, each of the delay circuits 310_1, 310_2, 310_3, . . . and 310_q may include at least one inverter.

The selection circuit 320 may be configured to select one of the plurality of delayed signals D(N−2), D(N−1), D(N), . . . and D(N+p) based on the count signal CNT, and provide a selected delayed signal SD. While the plurality of delayed signals D(N−2), D(N−1), D(N), . . . and D(N+p) may be generated with different delay times, the selected delayed signal SD with a specific delay time is provided according to the count signal CNT. The selection circuit 320 may be or include, for example, a multiplexer.

The driving signal output circuit 330 may include a tenth inverter 19 and a fourth operator L3. The driving signal output circuit 330 may be configured to perform a NOR operation or logic function on the inverted signal of the selected delayed signal SD and the complementary bank active signal BAB, and output the first driving signal SAP1.

The first driving signal SAP1 is enabled at a time when an active command is applied to a corresponding memory bank and is disabled after a selected delay time has passed. Therefore, the enable period of the first driving signal SAP1 is determined according to which delayed signal of the plurality of delayed signals D(N−2), D(N−1), D(N), . . . and D(N+p) is selected.

Figure 8:
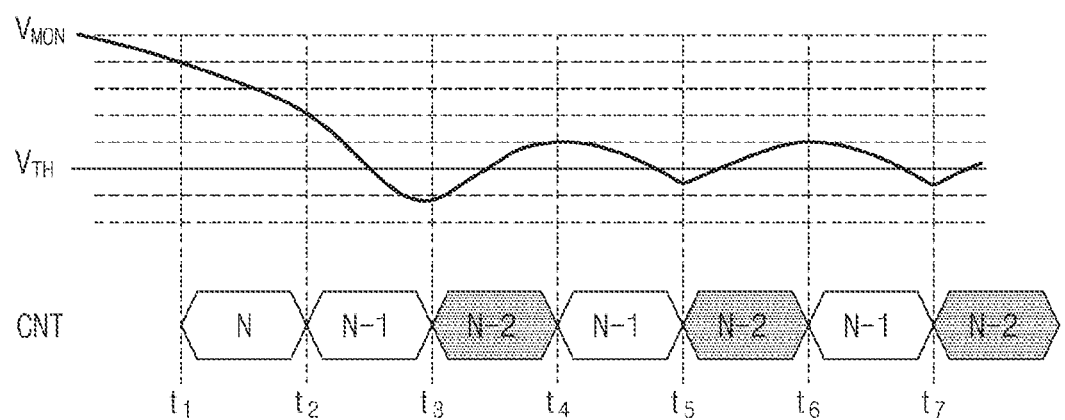
FIGS. 8 and 9 are representations of examples of diagrams to assist in the explanation of a count operation and changes in the enable period of a driving signal.
Figure 9:
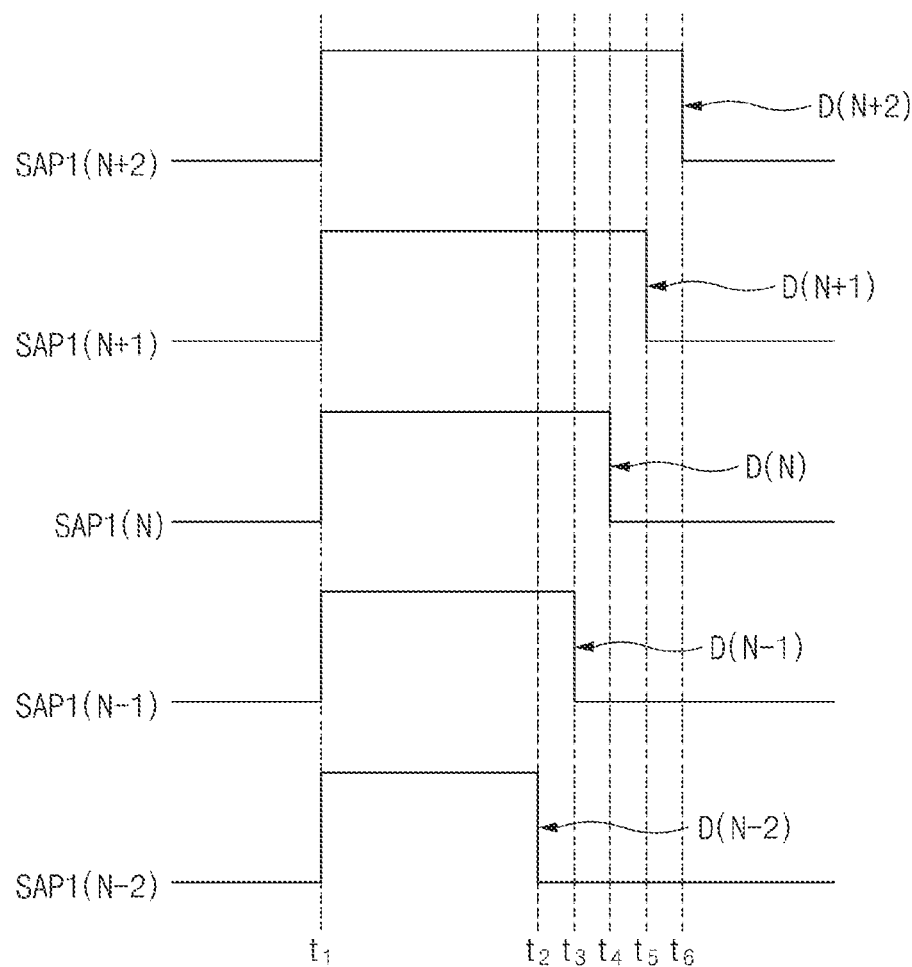

FIGS. 8 and 9 are representations of examples of diagrams to assist in the explanation of a count operation and changes in the enable period of a driving signal.

As shown in FIG. 8, the count signal CNT may be generated as the monitored voltage $V_{MON}$ and the threshold voltage $V_{TH}$ are compared with a predetermined time interval. According to an embodiment, a time at which the count signal CNT is changed may correspond to a time when the clock signal CLK is enabled.

At a time $t_1$, the magnitude of the monitored voltage $V_{MON}$ may be greater than the threshold voltage $V_{TH}$. The count signal CNT may indicate a value corresponding to 'N'. Accordingly, since the magnitude of the monitored voltage $V_{MON}$ is greater than the threshold voltage $V_{TH}$ while the count signal CNT has the value corresponding to 'N', the flag signal FLAG may be generated. Thus, the counter circuit 200 performs down counting in response to the clock signal CLK at a time $t_2$, and the value of the count signal CNT is decreased to 'N−1'.

The control circuit 300 may be configured to generate the first driving signal SAP1 with a shortened enable period according to the decreased value of the count signal CNT. Accordingly, an overdriving period may be shortened.

Also, even at the time $t_2$, since the magnitude of the monitored voltage $V_{MON}$ is greater than the threshold voltage $V_{TH}$, the flag signal FLAG may be generated according to the generation of the discharge signal RLP while the count signal CNT has the value of 'N−1'. As a consequence, at a time $t_3$, the counter 240 may perform down counting in response to the clock signal CLK, and the value of the count signal CNT becomes 'N−2'. Thus, the enable period of the first driving signal SAP1 may be further shortened.

At the time $t_3$, the monitored voltage $V_{MON}$ is less than the threshold voltage $V_{TH}$. Accordingly, the flag signal FLAG may not be generated between the time $t_3$ and a time $t_4$.

At the time $t_4$, the counter 240 may be configured to perform the up count operation in response to the clock signal CLK. Accordingly, the count signal CNT may have a value corresponding to 'N−1', and the enable period of the first driving signal SAP1 may be lengthened.

At the time $t_4$, since the monitored voltage $V_{MON}$ becomes greater than the threshold voltage $V_{TH}$, the flag signal FLAG may be generated. At a time $t_5$, the counter 240 may perform the down count operation, and the count signal CNT has the value of 'N−2'. Thus, during the period between the time $t_5$ and the time $t_6$, the enable period of the first driving signal SAP1 may be shortened such that an influence exerted on the core voltage $V_{CORE}$ by the power supply voltage $V_{DD}$ may also be reduced.

Similarly, the magnitude of the monitored voltage $V_{MON}$ may be less than the threshold voltage $V_{TH}$ at the time $t_5$. Thus, the count signal CNT may increase at a time $t_6$ and indicate 'N−1' as its value. The reason is that, since the magnitude of the monitored voltage $V_{MON}$ is greater than the threshold voltage $V_{TH}$ at the time $t_6$, the count signal CNT decreases at a time $t_7$ and indicates 'N−2' as its value.

FIG. 9 shows the first driving signal SAP1 which is outputted through the driving signal output circuit 330 in the control circuit 300 described above with reference to FIG. 7. The first driving signal SAP1 may be outputted according to the plurality of delayed signals D(N−2), D(N−1), D(N), . . . and D(N+p), Referring to FIG. 9, a time $t_1$ may correspond to a time when the complementary bank active signal BAB is enabled. The first driving signal SAP1 may be simultaneously enabled in response to a bank active command. The first driving signal SAP1 may start overdriving such that the voltage of the first sensing line RTO electrically coupled with a sense amplifier may be quickly raised.

A time at which the first driving signal SAP1 is disabled according to the count signal CNT (which is itself counted according to the magnitude of the core voltage $V_{CORE}$) is determined according to the plurality of delayed signals D(N−2), D(N−1), D(N), . . . and D(N+p).

At a time $t_2$, a first driving signal SAP1(N−2) may be disabled in response to the delayed signal D(N−2) which is delayed least. During the period between a time $t_3$ and a time $t_6$, the first driving signal SAP1 may be controlled to be disabled sequentially with lengthened enable periods.

According to the embodiment, first driving signals SAP1(N−2), SAP1(N−1), SAP1(N), SAP1(N+1) and SAP1(N+2) of the control circuit 300 may be generated. These signals may correspond to the case where the plurality of delayed signals D(N−2), D(N−1), D(N), . . . and D(N+p) are selected. As one of the plurality of delayed signals D(N−2), D(N−1), D(N), . . . and D(N+p) may be provided as the selected delayed signal SD based on the count signal CNT, the enable period of the final first driving signal SAP1 may be controlled.

Figure 10:
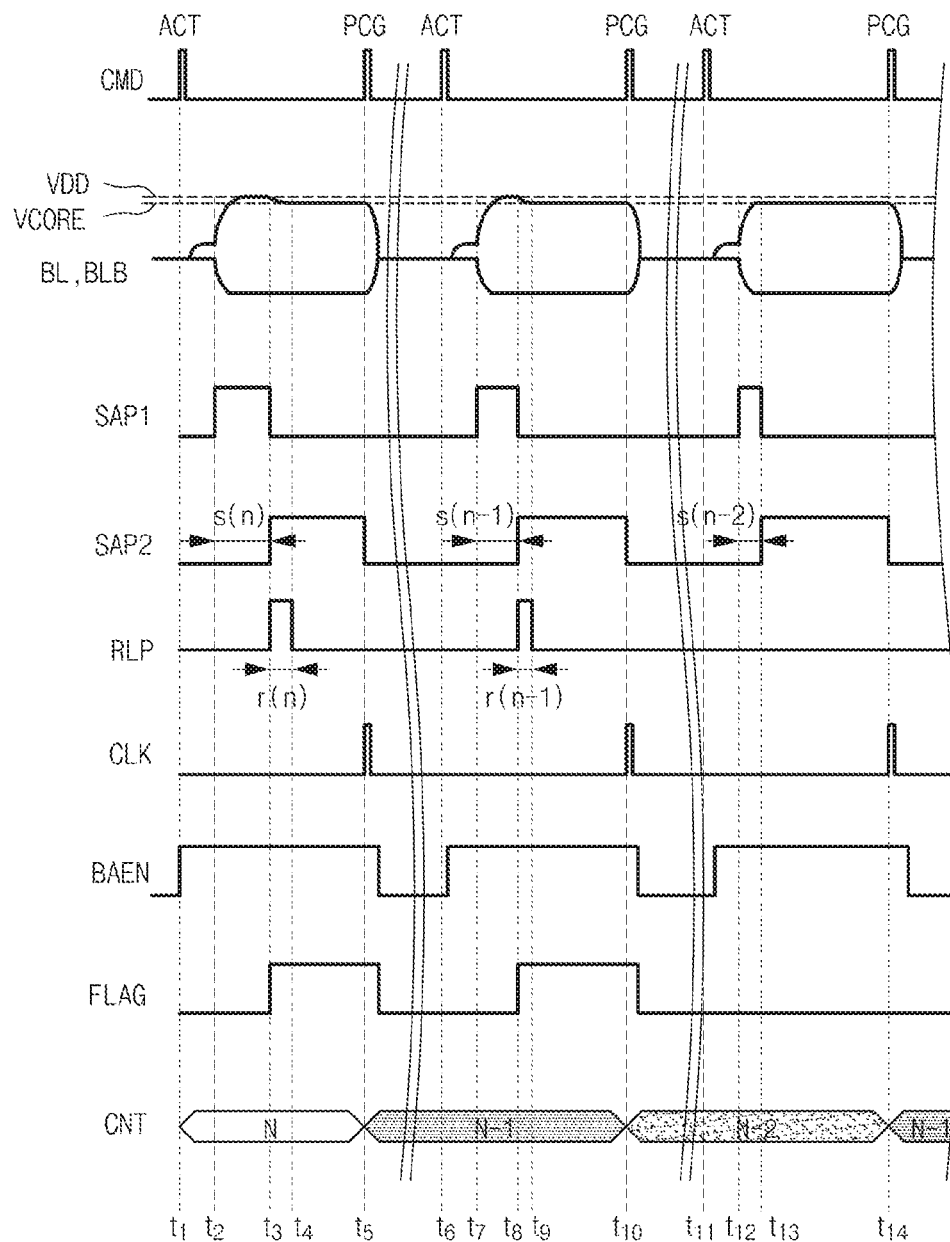
FIG. 10 is an example of a timing diagram to assist in the explanation of entire operations of the driving signal control circuit in accordance with the embodiment.

FIG. 10 is an example of a timing diagram to assist in the explanation of the operation of the driving signal control circuit in accordance with an embodiment.

Operations of the driving signal control circuit 10 in accordance with the embodiment will be described below with reference to FIGS. 1 to 10.

At a time $t_1$, an active command ACT may be applied. As at least one bank is activated in response to the active command ACT, the bank enable signal BAEN is enabled.

The start signal generator 210 may enable the clock signal CLK in response to the active command ACT. The start signal generator 210 may be configured to enable the clock signal CLK at a time $t_5$ after the predetermined time has passed from the time $t_1$ at which the active command ACT is enabled. Alternatively, the start signal generator 210 may be configured to generate the clock signal CLK immediately in response to a precharge command PCG which is applied at the time $t_5$.

A word line is enabled in response to the active command ACT. An electric charge difference is sensed between the bit line pair BL and BLB according to the charges stored in the cell of at least one of the cell transistors Cell TR1 and Cell TR2 of FIG. 2.

At a time $t_2$, the first driving signal SAP1 is enabled. In this case, a certain time may be delayed until the first driving signal SAP1 is enabled in response to the bank enable signal BAEN. As a fine charge difference is sensed between the bit line pair BL and BLB during a time in which the first driving signal SAP1 is enabled, stabilization may be provided.

The power supply voltage $V_{DD}$ is provided to the first sensing line RTO according to the first driving signal SAP1, and the charge difference between the bit line pair BL and BLB is developed up to the level of the power supply voltage $V_{DD}$.

At a time $t_3$, the first driving signal SAP1 is disabled. The second driving signal SAP2 for providing the core voltage $V_{CORE}$ to the first sensing line RTO is enabled. It may be seen that the enable period of the first driving signal SAP1 is initially set as s(n).

When the first driving signal SAP1 is disabled and the second driving signal SAP2 is enabled, the power supply voltage $V_{DD}$ may be introduced into the core voltage $V_{CORE}$. The comparator 120 senses that the magnitude of the core voltage $V_{CORE}$ is increased.

The comparator 120 outputs the enable signal EN, and, since the bank enable signal BAEN had been enabled as well, the discharge signal RLP is generated.

As the discharge signal RLP is generated, the flag signal FLAG is enabled. The enabled flag signal FLAG may be kept provided to the counter 240. Because the counter 240 operates in synchronization with the count output signal CNTO substantially the same as the clock signal CLK, the count signal CNT is still not changed.

The discharge signal RLP may be enabled during a time r(n) up to a time $t_4$. The length of time r(n) may be established in accordance with the degree the core voltage $V_{CORE}$ (precisely, the monitored voltage $V_{MON}$) is greater than the threshold voltage $V_{TH}$.

At the time $t_5$, an active operation may be ended as the second driving signal SAP2 is disabled. The precharge command PCG may be applied. As the active operation is completed, the bank enable signal BAEN is disabled. As the clock signal CLK is enabled, the counter 240 performs the down count operation based on the flag signal FLAG having been provided. As a result, generates the count signal CNT corresponding to the value of 'N−1'. The flag signal FLAG is initialized in response to the enabled clock signal CLK.

At a time $t_6$, an active command ACT is applied again, and the bank enable signal BAEN is enabled. The bit line pair BL and BLB also begins to develop to perform an active operation. The first driving signal SAP1 may be enabled at a time $t_7$ after the predetermined time has passed. Since the count value of the count signal CNT is decreased when compared to the case of the previous active operation, the enable period of the first driving signal SAP1 is decreased.

Accordingly, at a time $t_8$, the first driving signal SAP1 is disabled and the second driving signal SAP2 is enabled. Similarly as described above, at the time when the disable and enable of the first driving signal SAP1 and the second driving signal SAP2 occur, the power supply voltage $V_{DD}$ may be introduced into the core voltage $V_{CORE}$ through the first sensing line RTO. From the time $t_7$ to the time $t_8$, the voltage of the bit line pair BL and BLB is greater than the core voltage $V_{CORE}$. From this, it may be determined that the core voltage $V_{CORE}$ of the first sensing line RTO has been increased. The discharge circuit 100 determines that the core voltage $V_{CORE}$ is greater than the threshold voltage $V_{TH}$, and enables the discharge signal RLP.

The flag signal FLAG may be generated in response to the enabled discharge signal RLP. The discharge signal RLP is enabled during a time r(n−1) shorter than the case of the previous active operation, and is disabled at a time $t_9$. Since the enable period of the first driving signal SAP1 is shortened when compared to the previous active operation, it may be understood that a time during which the monitored voltage $V_{MON}$ has been greater than the threshold voltage $V_{TH}$ is also shortened.

Similarly as described above, the generated flag signal FLAG may be provided to the counter 240.

At a time $t_{10}$, the second driving signal SAP2 is disabled as the active operation is completed, and the bank enable signal BAEN is disabled too. The counter 240 may be configured to count the down count operation in response to the clock signal CLK. The count signal CNT may have a value corresponding to 'N−2'.

At a time $t_{11}$, an active command ACT for performing a next active operation may be again applied. Similarly to the previous active operations, the bank enable signal BAEN is enabled, and the charge difference of the bit line pair BL and BLB is developed.

At a time $t_{12}$, the first driving signal SAP1 is enabled. Because the count signal CNT has the value of 'N−2', the control circuit 300 provides a delayed signal. The delayed signal has a shorter enable period corresponding to the count signal CNT, as the selected delayed signal SD. Accordingly, the first driving signal SAP1 is disabled at a time $t_{13}$.

The power supply voltage $V_{DD}$ is provided to the first sensing line RTO for a time designated by s(N−2) (that is, a time between the time $t_{12}$ and the time $t_{13}$). Thus, a voltage up to which the bit line pair BL and BLB is driven is not raised to be greater than the cases of the previous active operations.

Accordingly, there is a case where the first driving signal SAP1 is disabled and the second driving signal SAP2 is enabled at the time $t_{13}$. Here, even though the bank enable signal BAEN is enabled, the comparator 120 does not determine that the monitored voltage $V_{MON}$ exceeds the threshold voltage $V_{TH}$. Therefore, the enable signal EN is not outputted in the discharge circuit 100. As a result, the discharge signal RLP is not enabled, and the flag signal FLAG is not generated.

Since the flag signal FLAG is not generated, the counter 240 performs the up count operation in synchronization with the clock signal CLK at a time $t_{14}$, and accordingly, the count signal CNT has the value or 'N−1'.

As described above, the driving signal control circuit 10 in accordance with the embodiment compares the magnitudes of the monitored voltage $V_{MON}$ (e.g. a voltage that is proportional to core voltage $V_{CORE}$) and the threshold voltage $V_{TH}$ at the time when at least one bank is activated.

The driving signal control circuit 10 enables the discharge signal RLP in the case where the magnitude of the monitored voltage $V_{MON}$ is greater than the magnitude of the threshold voltage $V_{TH}$. The flag signal FLAG is generated based on the generated discharge signal RLP. An up/down count operation is performed differently based on the flag signal FLAG. Also, the enable period of the first driving signal SAP1 is controlled based on the value of the count signal CNT.

Thus, since the enable period of the first driving signal SAP1 is controlled according to the magnitude of the monitored voltage $V_{MON}$ (e.g. a voltage that is proportional to the core voltage $V_{CORE}$, or the core voltage $V_{CORE}$ itself) during an active operation, the magnitude of an internal core voltage may be stabilized. Also, the enable period of the first driving signal SAP1 may be controlled through use of a simple count circuit.

In the embodiment of the present disclosure, as the core voltage $V_{CORE}$ and the threshold voltage $V_{TH}$ are compared, the count signal CNT is continuously changed according to which magnitude is large, and accordingly, the enable period of the first driving signal SAP1 may be changed.

If an operation for generating a flag signal FLAG and an operation for not generating the flag signal FLAG are alternated while performing a certain active operation according to the clock signal CLK. Here, operations in which the monitored voltage $V_{MON}$ becomes greater and less than the threshold voltage $V_{TH}$ are repeated. In this case, it may be determined that the monitored voltage $V_{MON}$ approaches the threshold voltage $V_{TH}$ within a predetermined range. Therefore, it may be determined that it is not necessary to repeat the operation of changing the period of the first driving voltage SAP1.

Hence, in the case where it is determined that the flag signal FLAG is intermittently generated within a predetermined range of the clock signal CLK (for example, a predetermined range in the number of times by which the clock signal CLK is enabled), control may be performed such that the count operation is not performed.

Figure 11:
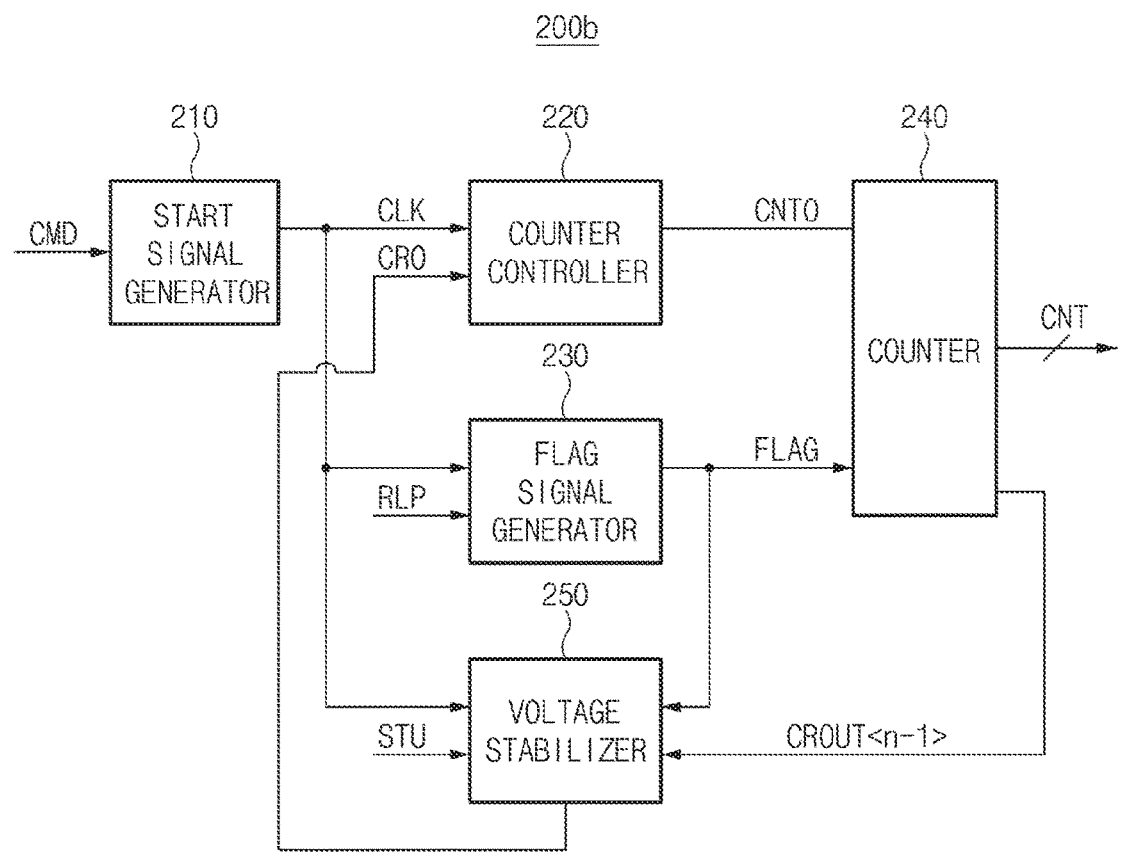
FIG. 11 is a block diagram illustrating an example of a counter circuit in accordance with an embodiment.

FIG. 11 is a block diagram illustrating an example of a counter circuit in accordance with an embodiment.

Referring to FIG. 11, a counter circuit 200b may include a start signal generator 210, a counter controller 220, a flag signal generator 230, a counter 240, and a voltage stabilizer 250.

When compared to the counter circuit 200a of FIG. 3, the counter circuit 200b of FIG. 11 may further include the voltage stabilizer 250. Because the other components are substantially the same as the components described above with reference to FIG. 3, detailed descriptions thereof will be omitted herein.

Referring to FIG. 11, the counter circuit 200b including the voltage stabilizer 250 may generate a carry output signal CRO, based on a final carry output bit CROUT<n−1> received from the counter 240 and a flag signal FLAG.

As described above, the flag signal FLAG is generated in the case where a monitored voltage $V_{MON}$ (i.e. a voltage that is proportional to the core voltage $V_{CORE}$, e.g. $V_{CORE}/2$, or even $V_{CORE}$ itself) is greater or equal to a threshold voltage $V_{TH}$ in an active operation. The flag signal FLAG is not generated in the case where the monitored voltage $V_{MON}$ is less than the threshold voltage $V_{TH}$. Therefore, in the case where the flag signal FLAG satisfies a predetermined condition, the carry output signal CRO is enabled to cause the counter controller 220 to interrupt the operation of the counter 240.

The counter controller 220 described above with reference to FIGS. 3 and 4 is configured to disable the count output signal CNTO regardless of the clock signal CLK. Also, the counter controller 220 is further configured to cause the counter 240 to interrupt the count operation, in the case where the final carry output bit CROUT<n−1> of the counter 240 is enabled.

The voltage stabilizer 250 may determine that the core voltage $V_{CORE}$ has a stabilized magnitude. This determination may be made if a process in which the flag signal FLAG is generated, a process in which the flag signal FLAG is not generated, and a process in which the flag signal FLAG is generated are sequentially performed. Here, since the monitored voltage $V_{MON}$ is changed in its magnitude with respect to the threshold voltage $V_{TH}$ according to the control of the period of a first driving signal SAP1, it is indirectly determined that the core voltage $V_{CORE}$ is stable at a desired magnitude.

Even though a suitable enable period of the first driving signal SAP1 to retain the stable magnitude of the core voltage $V_{CORE}$ is determined, an operation time may be lengthened or unnecessary power consumption may be caused. This may occur if the enable period of the first driving signal SAP1 is continuously controlled according to the count value of a count signal CNT. As is apparent, it is necessary to interrupt a count operation.

The voltage stabilizer 250 may be configured to generate the carry output signal CRO for interrupting the count operation of the counter 240. The voltage stabilizer 250 may provide the generated carry output signal CRO to the counter controller 220.

According to an embodiment, the voltage stabilizer 250 may be initialized in response to a start-up signal STU.

Figure 12:
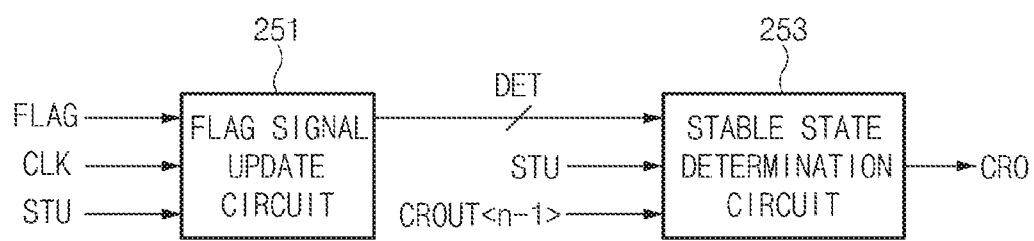
FIG. 12 is a block diagram illustrating an example of a voltage stabilizer in accordance with an embodiment.

FIG. 12 is a block diagram illustrating an example of a voltage stabilizer in accordance with an embodiment.

Referring to FIG. 12, the voltage stabilizer 250 may include a flag signal update circuit 251 and a stable state determination circuit 253.

The flag signal update circuit 251 may be configured to sequentially shift the flag signal FLAG in response to a clock signal CLK, and provide a plurality of determination signals DET. The plurality of determination signals DET may correspond to flag signals FLAG which are shifted when the clock signal CLK is enabled. Namely, the determination signals DET represent flag signals FLAG which are generated through sequential active operations.

According to an embodiment, the flag signal update circuit 251 may provide the determination signals DET by capturing a plurality of flag signals FLAG in synchronization with the clock signal CLK. Here, the stable state determination circuit 253 may determine a change pattern of the flag signals FLAG in the plurality of active operations based on the determination signals DET.

According to an embodiment, the flag signal update circuit 251 may be initialized in response to the start-up signal STU.

The stable state determination circuit 253 may be configured to enable the carry output signal CRO, based on at least one of the determination signals DET and the final carry output bit CROUT<n−1>.

The stable state determination circuit 253 may be configured to enable the carry output signal CRO. This enabling may be performed when it is determined based on the determination signals DET that the flag signals FLAG during the plurality of active operations show a predetermined pattern. Alternatively, this enabling may be performed when it is determined based on the final carry output bit CROUT<n−1> that the counter 240 has performed a maximum count operation.

According to an embodiment, the stable state determination circuit 253 may be initialized in response to the start-up signal STU.

Figure 13:
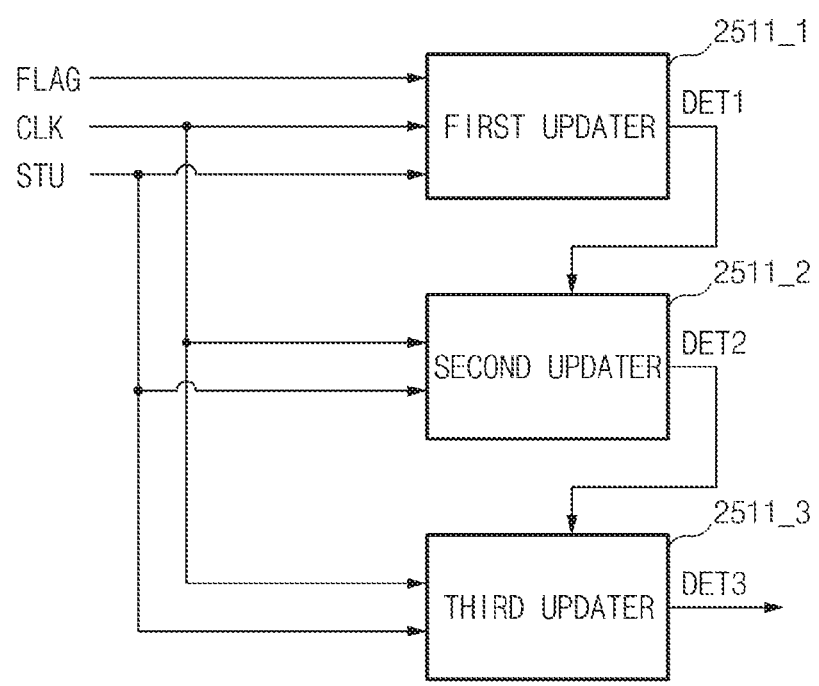
FIG. 13 is a block diagram illustrating an example of a flag signal update circuit in accordance with an embodiment.

FIG. 13 is a block diagram illustrating an example of a flag signal update circuit in accordance with an embodiment.

Referring to FIG. 13, the flag signal update circuit 251 may include a plurality of updaters 2511_1, 2511_2 and 2511_3. While three updaters 2511_1, 2511_2 and 2511_3 are shown in and will be described below with reference to FIG. 13, it is to be noted that the embodiment is not limited to such.

Based on the number of updaters included in the flag signal update circuit 251, it may be determined that the change pattern of the flag signals FLAG generated through how many number of active operation (i.e. in synchronization with how many number of clock signals CLK) is to be provided as the determination signals DET. In the flag signal update circuit 251 of FIG. 13, the flag signals FLAG may be captured through three active operations, that is, while the clock signal CLK is enabled three times, and may be provided as the determination signals DET.

The respective updaters 2511_1, 2511_2 and 2511_3 may be configured to store the flag signal FLAG, and output the stored flag signal FLAG as the determination signals DET in response to the clock signal CLK.

The first updater 2511_1 may be configured to store the flag signal FLAG. The first updater 2511_1 may be configured to provide the stored flag signal FLAG as a first determination signal DET1 to the second updater 2511_2 in response to the clock signal CLK.

The second updater 2511_2 may be configured to store the first determination signal DET1 provided from the first updater 2511_1, as the flag signal. The second updater 2511_2 may be configured to provide the stored flag signal as a second determination signal DET2 to the third updater 2511_3 in response to the clock signal CLK.

Similarly, the third updater 2511_3 may be configured to store the second determination signal DET2 provided from the second updater 2511_2, as the flag signal. The third updater 2511_3 may be configured to output the stored flag signal as a third determination signal DET3 in response to the clock signal CLK.

The flag signal update circuit 251 may correspond to a shift circuit which shifts the flag signal FLAG in response to the clock signal CLK. The flag signal update circuit 251 may be configured to provide the plurality of determination signals DET1, DET2 and DET3.

Figure 14:
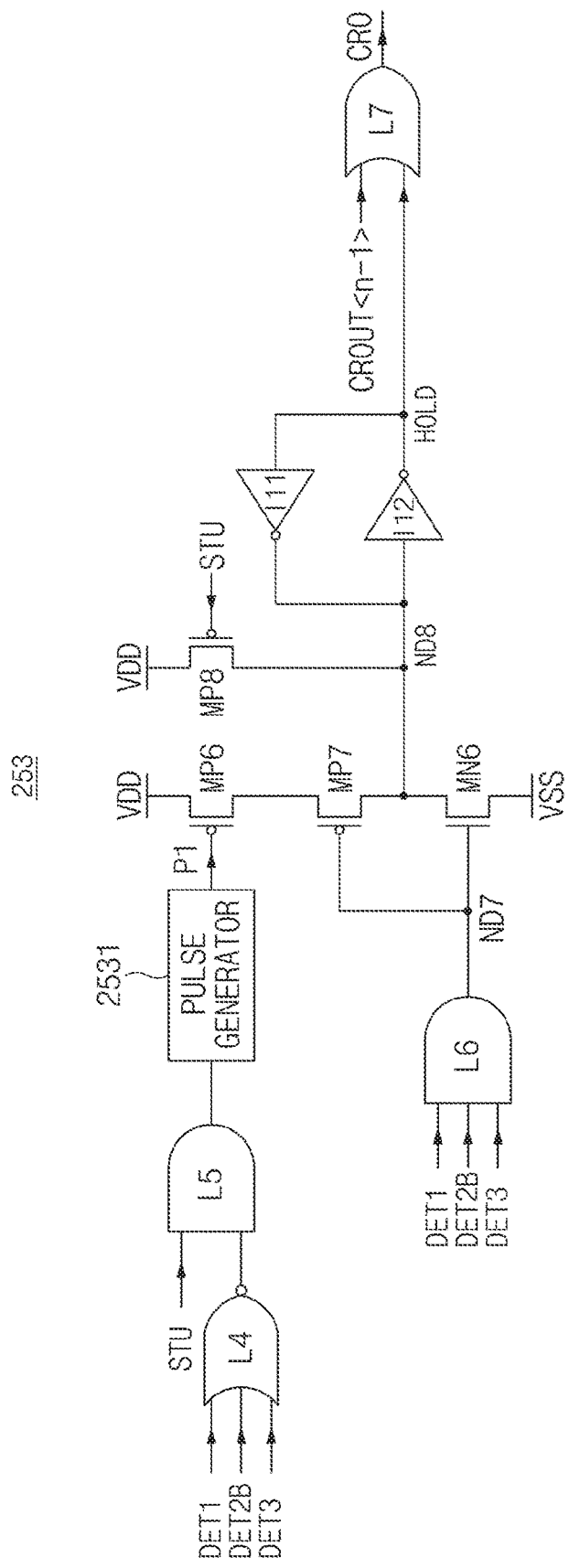
FIG. 14 is a diagram illustrating an example of a stable state determination circuit in accordance with an embodiment.

FIG. 14 is a diagram illustrating an example of a stable state determination circuit in accordance with an embodiment.

Referring to FIG. 14, the stable state determination circuit 253 may include a plurality of operators L4, L5, L6 and L7, a pulse generator 2531, a plurality of transistors MP6, MP7, MP8 and MN6, and a plurality of inverters I10 and I11.

The fifth operator L4 may be configured to perform a NOR operation or logic function on the first determination signal DET1, a complementary second determination signal DET2B and the third determination signal DET3.

The sixth operator L5 may be configured to perform an AND operation on the start-up signal STU and the signal provided from the fifth operator L4. The sixth operator L5 provides a resultant signal to the pulse generator 2531.

The pulse generator 2531 may be configured to generate a pulse P1 in the case where a voltage of a specified logic state is received. According to an embodiment, the pulse generator 2531 may be configured to generate the pulse P1 which is enabled by transitioning to a logic low state.

The seventh PMOS transistor MP6 may include a first terminal which is electrically coupled with the power supply voltage $V_{DD}$, and a gate terminal which is applied with the pulse P1.

According to an embodiment, the start-up signal STU may retain a voltage value corresponding to a logic high state not in the case of initialization. Therefore, in the case where even any one of the first determination signal DET1, the complementary second determination signal DET2B and the third determination signal DET3 has a different logic state, an input corresponding to a logic low state is provided to the pulse generator 2531, and the pulse P1 is generated.

The case where even one of the first determination signal DET1, the complementary second determination signal DET2B and the third determination signal DET3 has a different logic state, means all the other cases excluding the case where the flag signal FLAG is generated, is not generated and is generated during three successive active operations. By the pulse P1, the power supply voltage $V_{DD}$ may be provided to the second terminal of the seventh PMOS transistor MP6.

The seventh operator L6 may be configured to perform an AND operation on the first determination signal DET1, the complementary second determination signal DET2B and the third determination signal DET3, and provides a resultant signal to a seventh node ND7.

The eighth PMOS transistor MP7 may include a first terminal, a gate terminal, and a second terminal. The first terminal may be electrically coupled with the second terminal of the seventh PMOS transistor MP6. The gate terminal may be electrically coupled with the seventh node ND7. The second terminal may be electrically coupled with an eighth node ND8.

The seventh NMOS transistor MN6 may include a first terminal, a gate terminal, and a second terminal. The first terminal may be electrically coupled with the ground voltage $V_{SS}$. The gate terminal may be electrically coupled with the seventh node ND7. The second terminal may be electrically coupled with the eighth node ND8.

There is a case where the power supply voltage $V_{DD}$ is provided to the seventh PMOS transistor MP6. Here, the output of the seventh operator L6 (i.e. the voltage of the seventh node ND7) corresponds to a logic low state. The eighth PMOS transistor MP7 is turned on, and the seventh NMOS transistor MN6 is turned off.

Accordingly, as the eighth node ND8 corresponds to a logic high state, a hold signal HOLD is disabled to correspond to a logic low state. In this case, it is determined that the core voltage $V_{CORE}$ is not stable yet, and the enable period of the first driving signal SAP1 is changed by controlling the count signal CNT.

However, if the flag signal FLAG is generated, is not generated and is generated during three successive active operations, the pulse P1 is not generated, and the seventh node ND7 transitions to a logic high state. Thus, the eighth PMOS transistor MP7 is turned off and the seventh NMOS transistor MN6 is turned on.

The eighth node ND8 may correspond to a logic low state. Accordingly, the hold signal HOLD is enabled to a logic high state and the carry output signal CRO is enabled through the eighth operator L7.

According to an embodiment, the eighth operator L7 may be configured to perform an AND operation on the hold signal HOLD and the final carry output bit CROUT<n−1>. Therefore, the eighth operator L7 enables the carry output signal CRO in the case where the count operations of all the count circuits (see FIG. 6) of the counter 240 are completed.

Thus, the final carry output bit CROUT<n−1> may be enabled or the hold signal HOLD is enabled.

As a consequence, the stable state determination circuit 253 may be configured to cause the counter 240 to interrupt the count operation, such that the enable period of the first driving signal SAP1 is not controlled unnecessarily. This is true even when the flag signal FLAG reaches a predetermined state. Where the flag signal FLAG is unstable, the eighth node ND8 transitions to the logic high state, and the hold signal HOLD is disabled.

As described above, in the driving signal control circuit and the driving apparatus in accordance with the embodiments, the discharge signal RLP may be generated in the case where the monitored voltage $V_{MON}$ in an active operation exceeds the threshold voltage $V_{TH}$. The flag signal FLAG may be generated in response to the discharge signal RLP, a count operation may be performed according to whether the flag signal FLAG is generated or not, and the enable period of the first driving signal SAP1 may be changed according to a count value.

Accordingly, the enable period of the first driving signal SAP1 which performs overdriving may be controlled by using the discharge signal RLP. The discharge signal RLP controls the magnitude of the core voltage $V_{CORE}$, according to the magnitude of the core voltage $V_{CORE}$ which may vary while performing an active operation.

While various embodiments have been described above, it will be understood to those skilled in the art that the embodiments described are by way of example only. Accordingly, the driving signal control circuit and the driving apparatus described herein should not be limited based on the described embodiments.

The invention claimed is:

1. A driving signal control circuit, comprising:
   a discharge circuit configured to compare a monitored voltage and a reference voltage, and generate a discharge signal, the monitored voltage being proportional to a core voltage;
   a counter circuit configured to perform an up/down count operation according to the discharge signal, and generate a count signal; and
   a control circuit configured to generate a driving signal which has an enable period that is proportional to the count signal.

2. The driving signal control circuit according to claim 1, wherein the counter circuit comprises:
   a start signal generator configured to generate a clock signal based on a command signal;
   a flag signal generator configured to generate a flag signal based on the discharge signal; and
   a counter configured to count the flag signal based on the clock signal, and generate the count signal.

3. The driving signal control circuit according to claim 2, wherein the counter comprises a plurality of count circuits which perform the up/down count operation,
   wherein the count circuits are electrically coupled sequentially, and
   wherein the respective count circuits generate a plurality of count bits comprising the count signal.

4. The driving signal control circuit according to claim 3, wherein the counter circuit further comprises:
   a counter controller configured to provide a count output signal based on the clock signal and a carry output signal.

5. The driving signal control circuit according to claim 4, wherein the carry output signal corresponds to a carry output bit of a last count circuit among the plurality of count circuits.

6. The driving signal control circuit according to claim 4, wherein the counter circuit further comprises a voltage stabilizer comprising:
a flag signal update circuit configured to shift the flag signal based on the clock signal, and provide sequential flag signals as a plurality of determination signals; and
a stable state determination circuit configured to generate the carry output signal based on the plurality of determination signals.

7. The driving signal control circuit according to claim 6, wherein the stable state determination circuit enables the carry output signal in the case where the plurality of determination signals alternately have opposite logic states.

8. The driving signal control circuit according to claim 2, wherein the start signal generator generates the clock signal which is enabled after a preset time has passed in response to an active command.

9. The driving signal control circuit according to claim 2, wherein the control circuit comprises:
a plurality of delay circuits configured to delay a bank active signal which is generated in response to the active command, by a preselected time, and provide a plurality of delayed signals;
a selection circuit configured to provide one of the plurality of delayed signals, as a selected delayed signal, based on the count signal; and
a driving signal output circuit configured to perform a logic function on the bank active signal and the selected delayed signal, and provide the driving signal.

10. The driving signal control circuit according to claim 2, wherein the discharge circuit comprises:
a discharge circuit configured to electrically couple the core voltage with a ground voltage in response to the discharge signal.

11. A driving apparatus comprising:
a driving signal control circuit configured to generate a flag signal by comparing a monitored voltage and a reference voltage while an active operation is performed in response to a command signal, the monitored voltage being proportional to a core voltage;
the driving signal control circuit being further configured to generate a first driving signal which has a different enable period according to a count signal generated by performing an up/down count operation based on the flag signal; and
a driving circuit configured to provide a power supply voltage greater than the core voltage to a sense amplifier in response to the first driving signal.

12. The driving apparatus according to claim 11, wherein the driving signal control circuit generates a second driving signal after the first driving signal is enabled during the enable period.

13. The driving apparatus according to claim 12, wherein the driving circuit provides the core voltage to the sense amplifier in response to the second driving signal.

14. The driving apparatus according to claim 13, wherein the driving signal control circuit comprises:
a discharge circuit configured to compare the monitored voltage and the reference voltage, and generate a discharge signal;
a counter circuit configured to perform the up/down count operation according to the flag signal generated based on the discharge signal, and generate the count signal; and
a control circuit configured to generate the first driving signal which has an enable period proportional to the count signal.

15. The driving apparatus according to claim 14, wherein the counter circuit generates the count signal by performing the up count operation or the down count operation in synchronization with a clock signal generated based on an active signal and according to whether the flag signal is generated or not.

16. The driving apparatus according to claim 15, wherein the counter circuit comprises:
a counter including a plurality of count circuits, and configured to perform a count operation in synchronization with a count output signal; and
a counter controller configured to provide the count output signal based on the clock signal and a carry output signal.

17. The driving apparatus according to claim 16, wherein the counter controller provides the count output signal based on a carry output bit of a last count circuit among the plurality of count circuits or a generation history of the flag signal.

18. The driving apparatus according to claim 17, wherein the counter circuit further comprises:
a flag signal update circuit configured to shift the flag signal based on the clock signal, and provide sequential flag signals as a plurality of determination signals; and
a stable state determination circuit configured to enable the carry output signal in the case where the plurality of determination signals alternately have opposite logic states.

19. The driving apparatus according to claim 13, wherein further comprising:
the sense amplifier configured to develop a magnitude of charges stored in a memory cell to a level of the core voltage, based on the core voltage and the power supply voltage.

20. The driving apparatus according to claim 14, wherein the control circuit comprises:
a plurality of delay circuits configured to delay a bank active signal which is generated in response to an active command included in the command signal, by a preselected time, and provide a plurality of delayed signals;
a selection circuit configured to provide one of the plurality of delayed signals, as a selected delayed signal, based on the count signal; and
a driving signal output circuit configured to perform a logic function on the bank active signal and the selected delayed signal, and provide the first driving signal.

* * * * *